(12) United States Patent
Harvey et al.

(10) Patent No.: US 6,765,373 B1
(45) Date of Patent: Jul. 20, 2004

(54) CONTROL OF INITIAL CURRENT TRANSIENTS

(76) Inventors: David Harvey, 3518 Casanova Dr., San Mateo, CA (US) 94403; Mary Ann Schmitz, 3518 Casanova Dr., San Mateo, CA (US) 94403

(*) Notice: Subject to any disclaimer, the term of this patent is extended or adjusted under 35 U.S.C. 154(b) by 172 days.

(21) Appl. No.: 10/112,139

(22) Filed: Mar. 28, 2002

(51) Int. Cl.[7] .............................................. G05F 1/573
(52) U.S. Cl. .................... 323/277; 323/908; 363/56.03; 361/93.9
(58) Field of Search ................................. 323/275, 276, 323/277, 901, 908; 363/49, 50, 56.03; 361/57, 93.1, 93.9; 318/135; 326/93; 327/391

(56) References Cited

U.S. PATENT DOCUMENTS

| | | | |
|---|---|---|---|
| 4,973,892 A | * 11/1990 | Murata et al. | 318/135 |
| 5,450,334 A | 9/1995 | Pulizzi et al. | 364/492 |
| 2002/0105371 A1 | * 8/2002 | Nakaizumi | 327/391 |
| 2002/0167334 A1 | * 11/2002 | Nakaizumi | 326/93 |

* cited by examiner

Primary Examiner—Jessica Han

(57) ABSTRACT

Method and system for providing current transient control for N electrical devices, numbered ($N \geq 2$), where each device has an associated current transient I(n) upon power-up or power-down. Q subsets (preferably mutually exclusive) of devices are provided, where the sum of current transients (in-rush, etc.) for all devices in subset number q (q=1, . . . , Q; $Q \geq 2$) is no greater than a selected current value, such as (i) a maximum current that can be supplied by a current source or the maximum current that can be passed through a front end component associated with at least one device without injuring the device and (ii) a maximum current that can be supplied by a current source for power-up. A device may be redundantly assigned to more than one subset, to improve reliability. A time delay is implemented between power-up (or powerown) of any two distinct device subsets. Within an activated subset, a time delay is optionally implemented between any two distinct devices in the subset. Two or more subsets of devices can be activated separately and sequentially through receipt of an activation signal having a distinct value for each subset.

28 Claims, 3 Drawing Sheets

CONTROL OF INITIAL CURRENT TRANSIENTS

FIELD OF THE INVENTION

This invention relates to control of current transients in power-up or power-down of one or more electrical devices.

BACKGROUND OF THE INVENTION

When an electrical device is powered up or powered down, a current transient, reflecting an in-rush or other rapid change of current through one or more components of the device, often appears. This current is potentially damaging to the device, and the total current transient that must be initially delivered is often excessive. What is needed is an approach that limits or redistributes, or staggers the occurrence of, transient current within two or more selected device subsets so that (1) no component is likely to be damaged as a result of such current and (2) the amount of transient current required at any time is modest. Preferably, the approach should allow simultaneous or sequential delivery of current within any subset.

SUMMARY OF THE INVENTION

These needs are met by the invention, which sequentially supplies in-rush current to each of a plurality of electrical devices so that, at any time, only a limited number of devices experience a current transient (e.g., in-rush current) and only a limited amount of such current is delivered to any one device. In one embodiment, where two or more devices are to be powered up (or down) at approximately the same time, the devices are allocated to one or more mutually exclusive subsets of devices, and each subset of devices is powered up (or down) with a different associated time delay, or with a sequence of differing time delays within that subset. A current transient time interval associated with a first subset, during which all devices in the first subset are powered up, simultaneously or sequentially, overlaps insubstantially, or not at all, with a current transient time interval associated with a second subset, through incorporation of a time delay between power-up (or power-down) in any two consecutive device subsets.

DESCRIPTION OF THE BEST MODES OF THE INVENTION

Figure 1:
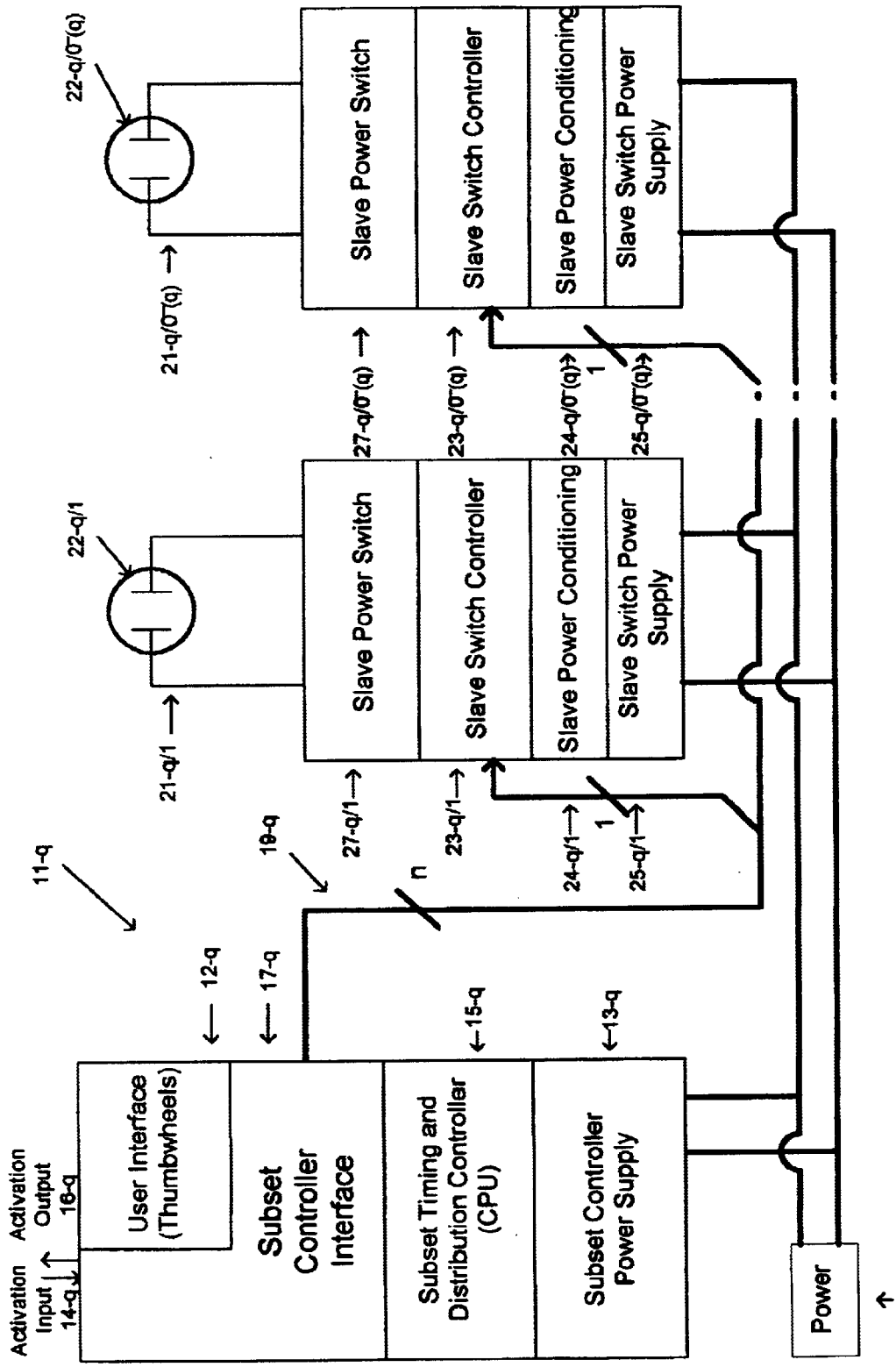
FIGS. 1 and 2 schematically illustrate an environment in which the invention can be used.

Assume that a set of N electrical devices, numbered $n=1, \ldots, N$ ($N \geq 2$), is to be powered up (or powered down) at approximately the same time. If the device number n requires an initial or in-rush current $I(n)$ upon power-up, and if all devices are powered up substantially simultaneously, the in-rush or initial transient current required for this power-up operation may be $$I(total) = \sum_{n=1}^{N} I(n). \tag{1}$$

If, for example, each of N=20 computer servers requires 40 Amps initially, the total current required initially is 800 Amps. Shortly after the power-up sequence is completed, the current required for each server may drop to 10 Amps or less so that 75 percent of the initial current capacity is un-used after the power-up sequence is completed. Further, a substantial portion of the 800 Amps may pass through a single pre-amplifier or other front end electrical component that serves many or all of the servers. This front end component may be unable to accommodate such a high current, even for a time as short as a few milliseconds (msec) so that this component may be "smoked" by the power-up sequence.

Assume, for convenience, that the sequence of transient currents $I(n)$ is arranged as a monotonically increasing sequence, $$I(n) \leq I(n+1)(n=1, \ldots, N-1) \tag{2}$$

or as a corresponding monotonically increasing sequence, with each current $I(n)$ no larger than the maximum current $I(max)$ that can be passed through any front end component.

In one embodiment of the invention, the devices are arranged in consecutively numbered subsets $$S1 = \{k0+1, k0+2, \ldots, k1\}, \tag{3-1}$$

...

$$Sq = \{k(q-1)+1, \ldots, kq\}, \tag{3-q}$$

...

$$SQ = z\{k(Q-1)+1 \ldots, kQ\} \tag{3-Q}$$

with $k0=1$ and $kQ=N$, where it is desired that the transient or in-rush currents in subset Sq satisfy $$I_q = \sum_{k=k(q-1)+1}^{k(q)} I(k) \leq I(max) \ (q=1, \ldots, Q), \tag{4}$$

where $I(max)$ may depend upon q and where all integers $1, 2, \ldots, N$ are represented at least once in the combined set $S1 \cup S2 \cup \ldots \cup SQ$.

This rearrangement into subsets ensures that the maximum current through any front end component associated with any device in a subset Sq is no larger than $I(max)$. The consecutive numbering of devices can be replaced by any other mutually exclusive numbering scheme as long as the sum of current transients for each subset is no larger than $I(max)$. Each subset Sq ($q=1, \ldots, Q$) of devices has a sequence of associated time delays $\tau(q';\text{subset } q)$ for power-up of device q' within that subset ($q'=k(q-1)+1, \ldots, k(q)$), and the time delays associated with any two different devices within a subset differ by at least a threshold amount $$|\tau(q';\text{subset } q) - \tau(q'';\text{subset } q)| \geq \Delta t(\text{thr;subset } q) \ (q' \neq q''), \tag{5}$$

where $\Delta t(\text{thr;subset } q)$ is a selected non-negative or positive number, including 0 if desired. The choice $\Delta t(\text{thr;subset } q)=0$ allows all devices within subset q to be powered up (or down) substantially simultaneously. Optionally, and less conveniently, the time offsets within a subset can be implemented with reference to the first time a device in this subset is powered up or down. A time delay between any two consecutively powered up subsets of devices is also imposed:

$$|\tau(q';\text{subset } q1) - \tau(q''';\text{subset } q1+1)| \geq \Delta t(\text{thr; } q1;q1+1), \tag{6}$$

where $\Delta t(\text{thr};q1;q1+1)$ is a selected positive value and q' and q''' are device indices corresponding to subset q1 and to subset q1+1, respectively.

Within each power-up subset Sq: (1) current may be delivered simultaneously to each device substantially simultaneously within that subset ($\Delta t(thr;subset\ q)=0$ in Eq. (5)); or (2) current may be delivered at spaced apart times to two or more devices within that subset, subject to a constraint, similar to Eq. (6), that all devices within the subset Sq receive current before any device in the next-in-time subset S(q+1) receives current.

In another embodiment, the Q subsets of devices are not mutually exclusive but are partially or fully redundant, with a selected group G of devices (or each device) being included in more than one of the Q subsets. Preferably, the constraints in Eqs. (4) are still imposed to ensure that current is efficiently delivered initially and to ensure that no front end component receives more current than the component can handle without injury. If a device in a subset Sq2 is already reliably receiving power, as a result of power-up of a preceding subset Sq1 (q1≠q2), that device is temporarily excluded from the subset Sq2 for this power-up cycle. However, if this device did not receive reliable current in a power-up of the preceding subset Sq1, this device remains within, and (again) receives current as a member of, the subsequent subset Sq2 at the appropriate time.

Preferably, no device is powered up more than once in a power-up cycle, except where the device is powered up and subsequently loses its reliable source of current. Providing redundancy for a device, through membership in more than one subset Sq, allows current to be provided to that device again, if that device no longer reliably receives current from a preceding current source in the power-up sequence.

FIG. 1 illustrates an environment in which a subset Sq including $\sigma(q)=k(q)-k(q-1)$ electrical devices, 22-q/k (numbered $k=k(q-1)+1, \ldots, k(q)$) is to be powered up (or powered down) at approximately the same time, through use of a subset controller module 11-q. A subset controller power supply 13-q supplies electrical power for a subset power timing and distribution controller 15-q. The subset controller 15-q determines the order and/or time delay and/or time duration of application of power to (or removal of power from) each of the devices 22-q/k in the subset and transmits a control signal through a subset controller interface 17-q along one of the control signal lines 19-q, one for each of the $\sigma(q)$ power use modules 21-q/k ($k=k(q-1)+1, \ldots, k(q)$). The control signal for the device 22-q/k in the subset is received by a slave switch controller 23-q/k that receives electrical power from a slave switch power supply 25-q/k. Each power use module 21-q/k also includes a slave power switch 27-q/k, controlled by the slave switch controller 23-q/k, that feeds a current receptacle associated with the device 22-q/k. Operation of each slave switch controller 23-q/k and its associated slave power switch 27-q/k is controlled by the timing and distribution controller 15-q.

The current for the device 22-q/k is provided by a power feed from one source or, optionally, from two or more such sources, and the current is optionally received and conditioned by a slave power conditioning module 24-q/k that is part of the slave switch power supply 25-q/k and/or part of the slave switch controller 23-q/k. The slave power conditioning module 24-q/k can supply one-phase, two-phase or three-phase current and can supply ac or dc current, depending upon the present need. The slave power conditioning module 24-q/k optionally includes a current interrupt detector that continually senses whether specified current is being reliably delivered to a device or a subset of devices. The controller module 11-q and slave switch power supplies 25-q/k are connected to a power source 18-q.

A user interface 12-q, optionally including thumbwheels, dip switches, buttons, command input through an interface port or similar user parameter selection mechanisms, is connected to the subset timing and distribution controller 15-q and/or to the subset controller interface 17-q, to provide a mechanism for user selection of one or more operating parameters for the system, such as I(max) or $\Delta t(thr;subset\ q)$ or $\Delta t(thr;q;q+1)$. Preferably, the system should be in a resting or non-active mode when a (new) selection of one or more operating parameters is entered through the user interface 12-q.

The system optionally includes an activation input terminal 14-q and an activation output terminal 16-q ($q=1, \ldots, Q$) that allow this system to be daisy-chained with one or more similar subsets so that a power-up (or power-down) sequence can be applied to two or more such subsets in a selected order. The daisy chain arrangement can also be used to add a new current transient control system, which controls one or more recently added devices, to an existing current transient control system. The daisy chain arrangement allows current transient control of an unlimited number of devices, or device subsets. After each device 22-q-k in a subset has been stepped through its power-up (or power-down) sequence, control is passed to the next device subset to perform a similar power-up (or power-down) sequence. Optionally, each timing and distribution to controller 15-q associated with an device subset Sq has a unique activation signal or indicium AS(q), and this controller does not become active until the controller receives and senses its own activation signal. A sequence of activation signals, each unique, can be provided by a master controller that is directly or indirectly connected to each timing and distribution controller 15-q through the corresponding activation input terminal 14-q, and each activation signal activates at most one of the device subsets. Receipt of an activation signal AS(q) may cause a particular current-carrying circuit to close or may cause some other change that allows flow of electric charge (or terminates such flow) within the associated device subset.

Figure 2:
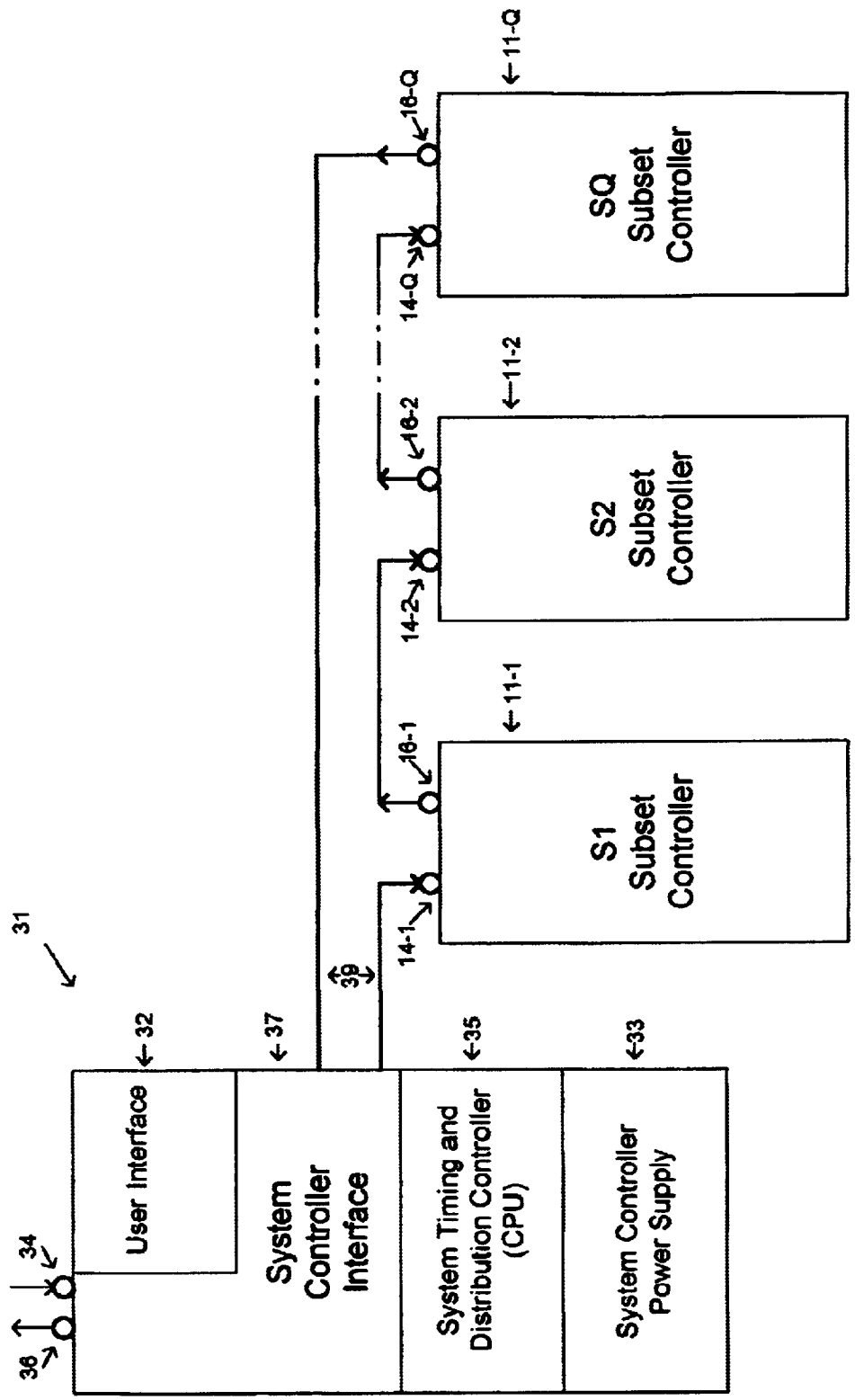

FIG. 2 schematically illustrates a system 31 for delivery of current to two or more subsets, S1, ..., SQ, according to the invention. A system controller power supply 33 supplies electrical power for a system power timing and distribution controller 35. The system controller 35 enforces the constraints set forth in Eq. (6) and determines the order and/or time delay and/or time duration of application of power to (or removal of power from) each of the device subsets Sq (q=1, ..., Q) and transmits a control signal through a system controller interface 37 along one of the system control signal lines 39, one for each subset controller module 11-q and the corresponding device subset Sq. The control signal for the device subset Sq is received by a subset controller 13-q (FIG. 1) that receives electrical power from a system power supply 18-q. Each subset controller module 11-q optionally includes a subset slave power switch 27-q/k (FIG. 1), controlled by the subset controller 15-q, that feeds a current receptacle associated with the device subset Sq. Operation of each subset controller 15-q and the associated slave power switches 27-q/k is controlled by the timing and distribution controller 35.

Figure 3:
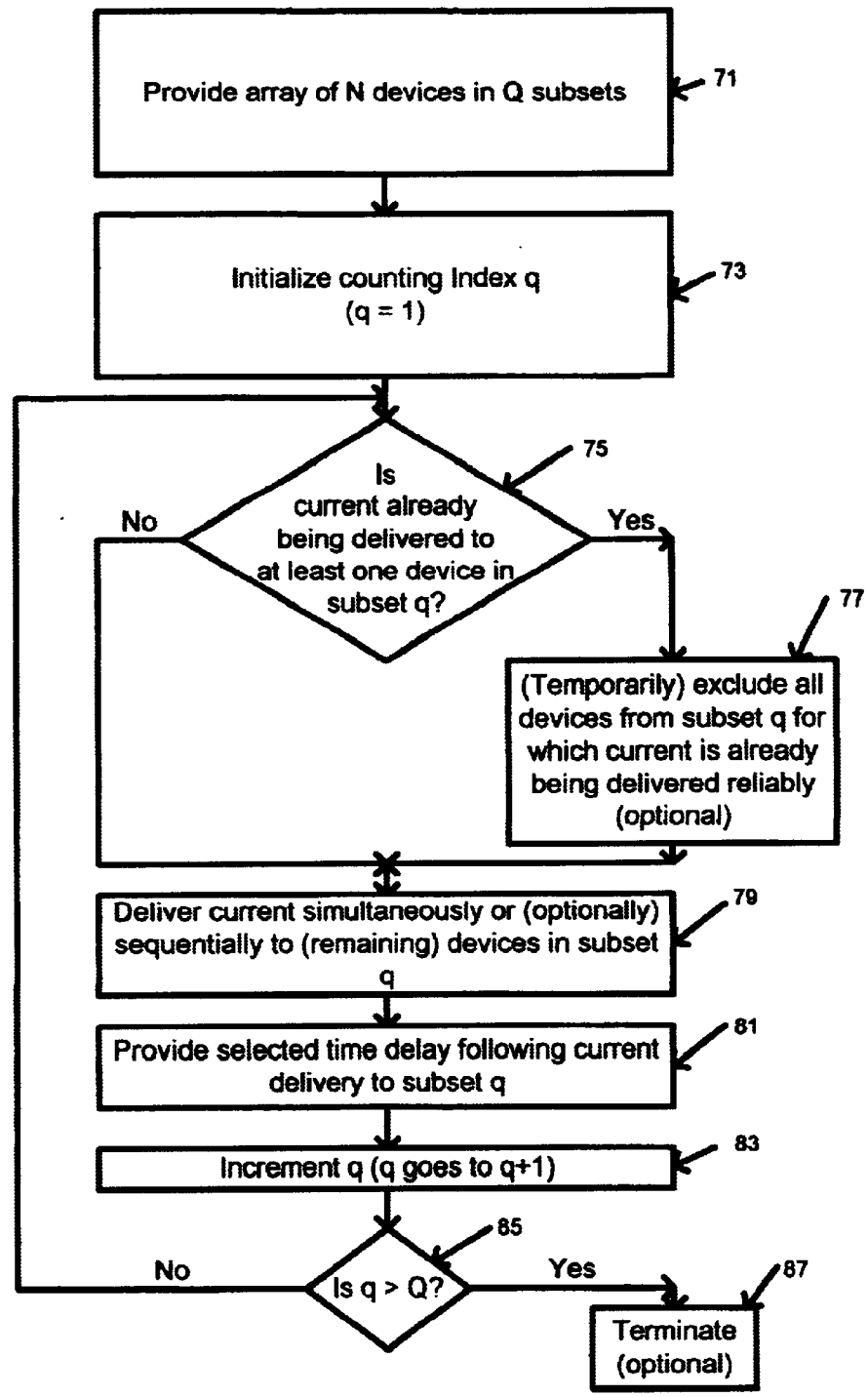
FIG. 3 is a flow chart of a procedure for practicing the invention.

FIG. 3 is a flow chart of a procedure for practicing the invention by a system. In step 71, each of an array of N electrical devices (N≧2) is assigned to one (or more than one) of Q subsets of such devices, numbered q=1, ..., Q (Q≧2), where the sum of all simultaneous transient currents required for power-up (or power-down) of subset number q is no greater than a selected maximum current value I^. Each device subset Sq may have one, or more than one, electrical device therein and may have more than one kind of device therein. In step 73, a counting index q is initialized (q=1). In step 75 (optional), the system determines if current is already being reliably delivered to at least one device in subset q. If the answer to the query in step 75 is "no", the system moves to step 79. If the answer to the query in step 75 is "yes", the system excludes the devices to which power is already being reliably delivered from subset Sq in this start-up cycle, in step 77 (optional), and moves to step 79. In step 79, current is delivered (simultaneously or sequentially, as desired) to each of the (remaining) devices in subset Sq, beginning at a selected time $t=t_q$.

In step 81, a time delay $\Delta t \geq \Delta t(thr;q;q+1)$ is introduced following power-up (or power-down) of the devices in subset Sq. In step 83, the index q is incremented (q→q+1). In step 85, the system determines if the (incremented) q value satisfies q>Q. If the answer to the query in step 85 is "no," the system returns to step 75. If the answer to the query in step 85 is "yes," the procedure terminates, in step 87 (optional).

A time delay for a given device may be measured or imposed relative to (i) the time a first device in that subset responds, (ii) the time a device in the same subset, immediately preceding the given device, responds, (iii) the time a device in another device subset responds and/or (iv) an absolute time, measured without reference to a time associated with any device or device subset.

The preceding discussion has focused on a power-up cycle. The invention can also be used in a power-down cycle, to avoid generation of current termination transients of a magnitude that can also damage electrical components. In a power-down cycle, Eq. (4) is reformulated to apply to transients arising from termination of current or power to the respective devices or subsets of devices.

The preceding examples are introduced for illustrative purposes only and are not intended to limit the scope of the invention.

What is claimed is:

1. A method for providing power for N1 electrical devices, numbered n=1, ..., N1 (N1≧2), where each device has an associated current transient I(n) upon power-up or power-down, the method comprising:

providing a set of Q1 subsets of the N1 devices, numbered q=1, ..., Q1, where Q1 is an integer ≧2 and the sum of the current transients I(n), for at least one of device power-up and device power-down, for all devices in at least one subset number q is no greater than a selected current value I(max;q) that may depend upon q; and when at least one device in subset q' and at least one device in subset q'+1 are in an active mode for at least one index q' (1≦q'≦Q1−1), (i) initiating delivery of current to the devices in subset number q' at a selected time t(q') and (ii) initiating delivery of current to the devices in subset number q'+1 at a selected time t(q'+1), where t(q'+1)−t(q') is at least equal to a selected positive threshold time delay $\Delta t(thr;q';q'+1)$.

2. The method of claim 1, further comprising providing a parameter adjustment mechanism that allows a selection of at least one operating parameter for at least one of said current values I(max;q).

3. The method of claim 1, further comprising providing, for at least one of said N1 devices, power conditioning that includes at least one of the following current characteristics: direct current, alternating current, single-phase current, two-phase current and three-phase current.

4. The method of claim 1, further comprising providing a parameter adjustment mechanism that allows a selection of at least one operating parameter for at least one of said current values I(max;q) and said threshold time delays $\Delta t(thr;q';q'+1)$.

5. The method of claim 1, further comprising:

choosing said number Q1 to be ≧2; and when said set of N1 devices is in an active mode, for at least one index q' (1≦q'≦Q1−1), (i) initiating delivery of current to said devices in subset number q' at a selected time t(q') and (ii) initiating delivery of current to said devices in subset number q'+1 at a selected time t(q'+1), where t(q'+1)−t(q') is at least equal to a selected positive threshold time delay $\Delta t(thr)$ that is independent of at least one of the times t(q') and t(q'+1).

6. The method of claim 5, further comprising providing a parameter adjustment mechanism that allows a selection of at least one operating parameter for at least one of said current values I(max;q) and said threshold time delays $\Delta t(thr)$.

7. The method of claim 1, further comprising selecting said current value I(max;q) to be no greater than an estimated maximum current value that can be supplied by a current source that provides power-up for said devices.

8. The method of claim 1, further comprising selecting said current value I(max;q) to be no greater than an estimated maximum current value that can be passed through an electrical component associated with one of said devices without injuring said device through which said current is passed.

9. The method of claim 1, further comprising initiating delivery of current to all of said devices in said subset q substantially simultaneously.

10. The method of claim 1, further comprising initiating delivery of current to at least two of said devices, q' and q", in said subset q at selected times that are spaced apart from each other by at least a selected non-negative value $\Delta t(thr;subset\ q)$.

11. The method of claim 1, further comprising providing said Q1 subsets as mutually exclusive subsets.

12. The method of claim 1, further comprising assigning at least one selected device to at least two of said Q1 subsets, number q1 and number q2, with q1≠q2.

13. The method of claim 12, further comprising:

determining if said selected device in said subset q1 is receiving reliable current; and when said selected device in said subset q1 is not receiving reliable current, initiating delivery of current to said selected device, as part of said subset q2, when current is delivered to said subset q2.

14. The method of claim 1, further comprising:

providing a second set of Q2 subsets of N2 of said devices, indexed q'=Q1+1, ..., Q1+1, ..., Q1+Q2, where Q2 is an integer ≧1 and the sum of the current transients I(n') for all devices in at least one subset number q' is no greater than a selected current value I(max;q');

when the second set of N2 devices is in an active mode, for at least one index q' (Q1+1≦q'≦Q1+Q2), (i) initiating delivery of current to the devices in subset number q' in the second set at a selected time t(q') and (ii) initiating delivery of current to the devices in the subset number q'+1 at a selected time t(q'+1), where t(q'+1)−t(q') is at least equal to a selected positive threshold time delay $\Delta t(thr;q';q'+1)$; and providing an activation signal that is received by said first set of said N1 devices and by the second set of N2 devices, and activating said first set or the second set only if the activation signal has a first activation value or a second activation value, respectively.

15. A system for providing power-up or power-down of N1 electrical devices, numbered n=1, ..., N1 (N1≧2), where each device has an associated current in-rush $I(n)$ upon power-up, the system comprising:

a current source that supplies up to an estimated maximum current; and a computer that is programmed:

to provide Q1 subsets of the N devices, indexed $q=1, \ldots, Q1$, where Q1 is an integer $\geq 2°$ and the sum of the current transients $I(n)$, for at least one of device power-up and device power-down, for all devices in at least one subset number q is no greater than a selected current value $I(max;q)$ that may depend upon q; and when at least one device in subset q' and at least one device in subset q"+1 are in an active mode, for at least one index q ' ($1 \leq q' < Q1-1$), (i) to initiate delivery of current to the devices in subset number q' at a selected time $t(q')$, and (ii) to initiate delivery of current to the devices in subset number q'+1, at a selected time $t(q'+1)$, where $t(q'+1)-t(q')$ is at least equal to a selected positive threshold time delay $\Delta t(thr;q';q'+1)$.

16. The system of claim 15, further comprising, for at least one of said N1 devices, a power conditioning module that provides at least one of the following current characteristics: direct current, alternating current, single-phase current, two-phase current and three-phase current.

17. The system of claim 15, further comprising a parameter adjustment mechanism that allows a selection of at least one operating parameter for at least one of said current values $I(max;q)$.

18. The system of claim 15, wherein said computer is further programmed:

to provide a second set of Q2 subsets of N2 of said devices, indexed $q'=Q1+1, \ldots, Q1+Q2$, where Q2 is an integer $\geq 1$ and the sum of the current transients $I(n')$ for all devices in at least one subset number q' is no greater than a selected current value $I(max;q')$ that may depend upon q';

when the second set of N2 devices is in an active mode, for at least one index q' ($Q1+1 \leq q' \leq Q1+Q2$), (i) to initiate delivery of current to the devices in subset number q' in the second set at a selected time $t(q')$ and (ii) to initiate delivery of current to the devices in subset number q'+1 at a selected time $t(q'+1)$, where $t(q'+1)-t(q')$ is at least equal to a selected positive threshold time delay $\Delta t(thr;q';q'+1)$; and to provide an activation signal that is received by said first set of said N1 devices and by the second set of N2 devices, and to activate said first set or the second set only if the activation signal has a first activation value or a second activation value, respectively.

19. The system of claim 15, further comprising a parameter adjustment mechanism that allows a selection of at least one operating parameter for at least one of said current values $I(max;q)$ and said time delays $\Delta t(thr;q';q"+1)$.

20. The system of claim 15, wherein said computer is further programmed so that:

said integer Q1 is at least equal to 2; and when the set of N1 devices is in an active mode, for at least one index q' ($1 \leq q' \leq Q1-1$), (i) to initiate delivery of current to the devices in subset number q' at a selected time $t(q')$, and (ii) to initiate delivery of current to the devices in subset number q'+1, at a selected time $t(q'+1)$, where $t(q'+1)-t(q')$ is at least equal to a selected positive threshold time delay $\Delta t(thr)$ that is independent of at least one of the times $t(q')$ and $t(q'+1)$.

21. The system of claim 20, further comprising a parameter adjustment mechanism that allows a selection of at least one operating parameter for at least one of said current values $I(max;q)$ and said time delays $\Delta t(thr)$.

22. The system of claim 15, wherein said current value $I(max;q)$ is selected to be no greater than an estimated maximum current value that can be supplied by a current source that provides power-up for said devices.

23. The system of claim 15, wherein said current value $I(max;q)$ is selected to be no greater than an estimated maximum current value that can be passed through an electrical component associated with one of said devices without injuring said device through which said current is passed.

24. The system of claim 15, wherein said computer is further programmed to deliver current to all of said devices in said subset q substantially simultaneously.

25. The system of claim 15, wherein said computer is further programmed to deliver current to at least two of said devices in said subset q at selected times that are spaced apart from each other by at least a selected non-negative value $\Delta t(thr;subset\ q)$.

26. The system of claim 15, wherein said computer is further programmed to provide said Q1 subsets as mutually exclusive subsets.

27. The system of claim 15, wherein said computer is further programmed to assign at least one selected device to at least two of said Q1 subsets, number q1 and q2, with q1<q2.

28. The system of claim 27, wherein said computer is further programmed:

to determine if said selected device in said subset q1 is receiving reliable current; and when said selected device in the subset q1 is not receiving reliable current, to initiate delivery of current to said selected device, as part of said subset q2, when current is delivered to said subset q2.

* * * * *